United States Patent [19]

Abbott et al.

[11] Patent Number: 4,697,543

[45] Date of Patent: Oct. 6, 1987

[54] LIQUID PHASE EPITAXY SLIDER/STATOR ASSEMBLY HAVING NON-WETTING GROWTH WELL LINERS

[75] Inventors: Richard C. Abbott, Arlington; Honnavalli R. Vydyanath, Sudbury, both of Mass.

[73] Assignee: Honeywell Inc., Minneapolis, Minn.

[21] Appl. No.: 846,674

[22] Filed: Mar. 31, 1986

Related U.S. Application Data

[63] Continuation of Ser. No. 664,493, Dec. 13, 1983, abandoned, which is a continuation of Ser. No. 361,706, Mar. 25, 1982, abandoned.

[51] Int. Cl.$^4$ .......................... B05C 3/09; H01L 7/38
[52] U.S. Cl. .................................. 118/412; 118/415; 118/421
[58] Field of Search .............. 118/412, 421, 415, 422; 156/622; 148/171, 172

[56] References Cited

U.S. PATENT DOCUMENTS

| | | | |
|---|---|---|---|
| 3,747,562 | 7/1973 | Stone | 118/412 X |
| 4,033,291 | 7/1977 | Naito et al. | 118/415 X |
| 4,317,689 | 3/1982 | Bowers et al. | 118/415 X |

OTHER PUBLICATIONS

Journal of Crystal Growth, "Use of Sapphire Liners to Eliminate Edge Growth in LPE (Al,Ga)As," Tamargo et al, Feb. 1981, pp. 325-329.

*Primary Examiner*—John P. McIntosh
*Attorney, Agent, or Firm*—John S. Solakian; George A. Leone, Sr.

[57] ABSTRACT

A slider/stator device for the growth of thin film material, such as mercury cadmium telluride, in which the substrate, thin film and growth solution are kept free from impurities by use of sleeves, made, for example, from sapphire, in order to prevent contamination and adhesion of the growth solution to the slider assembly.

6 Claims, 6 Drawing Figures

LIQUID PHASE EPITAXY SLIDER/STATOR ASSEMBLY HAVING NON-WETTING GROWTH WELL LINERS

This application is a continuation of copending Ser. No. 664,493 filed Dec. 13, 1983, now abandoned; which in turn is a continuation of copending Ser. No. 361,706, filed Mar. 25, 1982, now abandoned.

BACKGROUND OF THE INVENTION

The present invention relates generally to devices used in the growth of semiconductor material by the process of liquid phase epitaxy, and, more particularly, to slider/stator devices used in the growth of mercury cadmium telluride (HgCdTe).

HgCdTe is a semiconductor material similar to silicon, germanium and gallium arsenide. It is extremely useful as a sensing material in thermal imaging systems. One distinguishing feature of HgCdTe is that a slight variation of the relative proportions of mercury and cadmium changes the spectral sensitivity of the material. Although this can be a great advantage in designing infrared detectors, it means that the quantity of impurities in the material must be strictly controlled, since they may also alter the electrical properties of the material.

Liquid phase epitaxy (LPE) is a common method for growing high purity HgCdTe. In LPE, a molten solution of mercury and cadmium dissolved in tellurium is placed in contact with a cadmium telluride (CdTe) crystalline substrate. By reducing the temperature, mercury, cadmium and tellurium are forced to precipitate, forming a thin film HgCdTe crystal on the CdTe substrate. One of the most common techniques for growing LPE HgCdTe uses a sliding assembly to bring the molten growth solution in contact with the CdTe substrate.

In the slider technique, a substrate is placed in a recessed well in the top surface of the stator, or base, of the device, such that the surfaces of the stator and substrate are substantially co-planar. The slider, which is positioned on the stator, includes a well which holds the molten growth solution. Typically, this well extends through the slider so that the growth material may be loaded through the top of the slider. In the proper configuration for film growth, the slider is positioned so that the bottom of the growth solution well is in close proximity with, but does not touch, the substrate. The entire assembly is heated until the growth material is at the required temperature, and then the slider is moved so that the well holding the growth solution is positioned above the substrate. When the temperature is dropped, the HgCdTe precipitates as a thin film on the substrate. When the crystal growth is complete, the slider is retracted so that the growth solution is no longer in contact with the substrate and the thin film, and the entire assembly is cooled to room temperature. Although the technique appears uncomplicated, there are several problems which reduce the quality of the thin film grown. In the past, both slider and stator have been made of graphite, a refractory material which is both chemically nonreactive and easily machinable. Typically, the graphite which is used has been treated, impregnated with a hydrocarbon pitch and cured to reduce porosity and improve mechanical properties. It is then heated to a high temperature to drive off impurities and improve electrical properties.

Despite these improvements, the design and composition of the slider still cause degradation in the film quality and yield. First, the graphite surfaces of the slider flake and crumble into the growth solution. These particles adhere to the film and reduce performance. Second, impurities in the graphite tend to leach into the growth solution at high temperatures, resulting in contamination which alters the electrical properties of the material. Finally, because the tellurium-rich melt solution wets graphite, it tends to seep into any gaps between the stator and substrate, effectively welding the finished thin films and substrate to the stator.

Excessive film growth at the interface of the substrate and the growth well interface has been noticed in LPE growth of gallium aluminum arsenide using the slider technique. This growth is the result of thermally induced convection currents in the growth solution which are produced when the slider assembly is cooled to force film precipitation. This problem has been solved by lining the growth solution well with an insulating material, for example, sapphire, which reduces convection within the melt solution. For example, see the paper by Tamargo, M. C. and Reynolds, C. L., entitled "Use of Sapphire Liners to Eliminate Edge Growth in LPE (Al,Ga)As, *Journal of Crystal Growth*, Vol. 55, pp. 325-329 (1981), published by North-Holland Publishing Company. Although excessive edge growth does not occur in the growth of LPE HgCdTe, it has been found by the present invention that sapphire can be used in the design of the slider and stator to eliminate the design and contamination problems described above.

It is accordingly a primary object of the present invention to provide an improved apparatus for the growth of thin film semiconductors, particularly HgCdTe, by use of a slider/stator technique.

SUMMARY OF THE INVENTION

The above and other objects of the present invention are achieved by lining substantially all surfaces of the slider/stator assembly which contact the growth solution with a dense, pure, nonwetting material. In a preferred embodiment this material is monocrystalline sapphire. The growth well of the slider is lined with a sapphire sleeve and cap.

BRIEF DESCRIPTION OF THE DRAWINGS

The objects of the present invention are achieved in the illustrative embodiment as described with respect to the Figures in which.

DETAILED DESCRIPTION OF THE PREFERRED EMBODIMENT(S)

Figure 1:
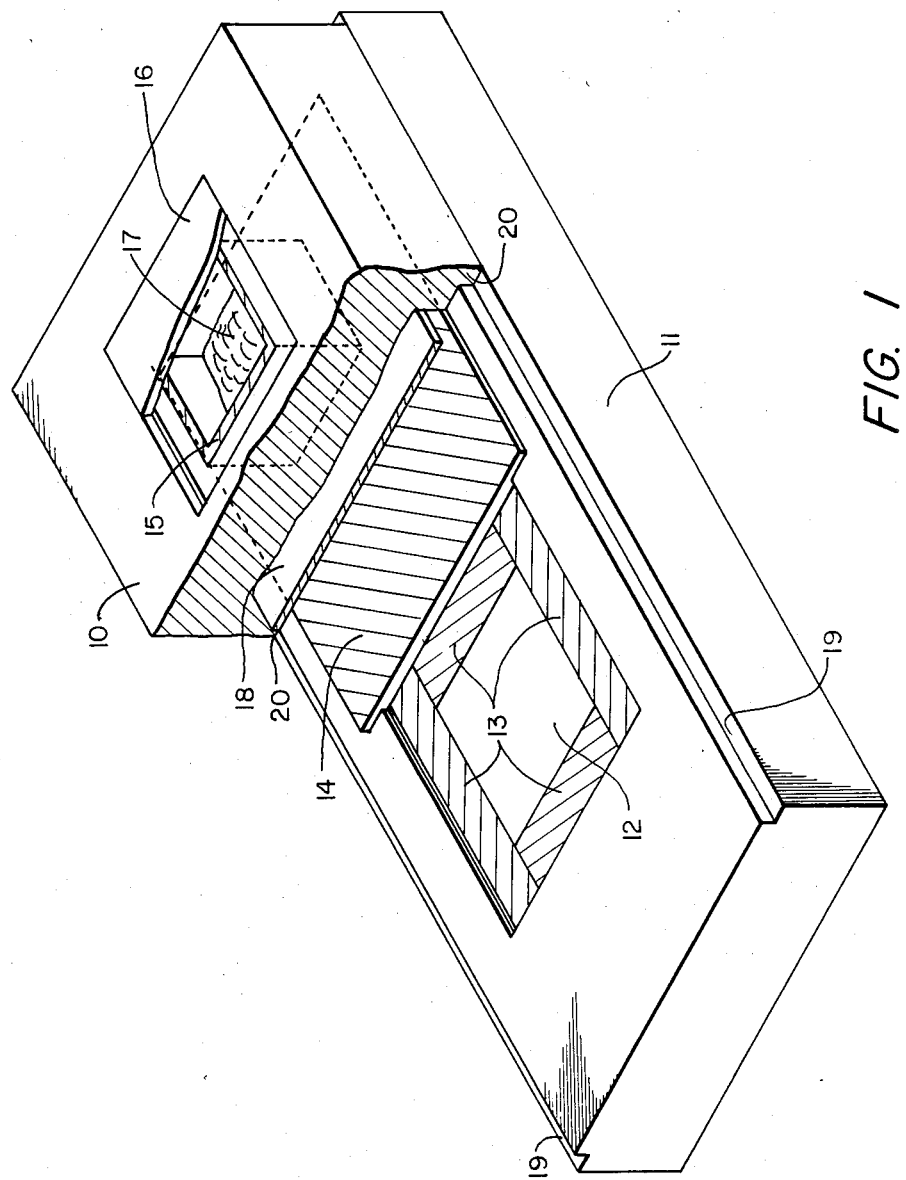
FIG. 1 shows an isometric view of a slider assembly according to the present invention.
Figure 2A:
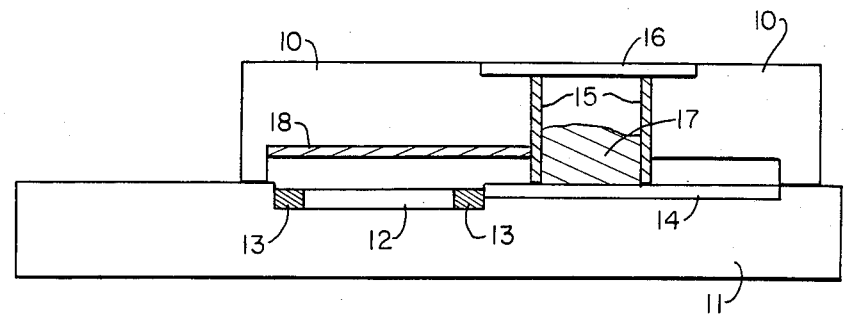
FIGS. 2A, 2B and 2C show cross-sectional side views on the subject invention during successive stages of LPE thin film manufacture.
Figure 2B:
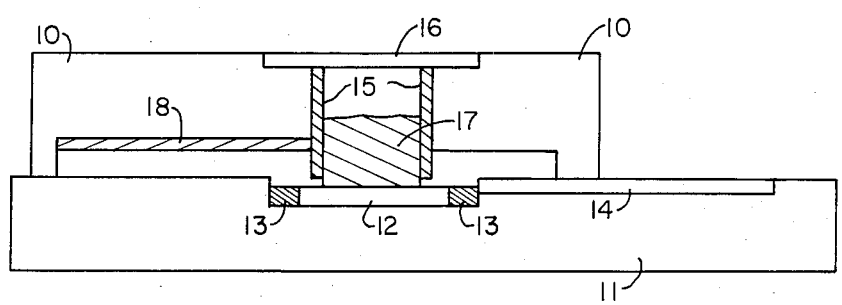

Referring to FIGS. 1 and 2, the device of the present invention include a base, or stator 11, and sliding assembly 10. The slider 10 can be moved along the length of stator 11, by virtue of a matched set of grooves 19 and rails 20 included in the stator 11 and slider 10, respectively. Two positions of the slider 10 are shown in FIGS. 2A and 2B. Movement of the slider can be controlled by a pushrod, by tilting the assembly, or some other external means. All surfaces of the assembly which might contact or provide a source of particular contamination to the growth solution 17 are lined with a dense, pure, refactory and nonwetting material, such as monocrystalline sapphire.

The stator 11 and slider 10 are machined from solid blocks of graphite. The overall size of the stator and slider is determined by the size of the desired thin film and associated substrate 12. Substrate spacers 13, well cap 16, stator cover 14, slider liner plate 18, and growth solution well liner 15 are made from planks or tubes of monocrystalline sapphire. In an alternate embodiment, the above-noted parts made from sapphire might instead be made from polycrystalline alumina. All graphite and sapphire parts are purified before use by baking at high temperatures, for example, 1000 degrees Centigrade, under low pressures, for example, ten to the minus six torr, in a chemically inert environment. All sapphire surfaces are lapped smooth to about 100 microinches. Graphite surfaces are rough milled and mated through use.

The stator 11 is machined with two abutting rectangular wells. One well is used to hold the thin film substrate 12 with associated spacers 13, and the other well includes stator cover plate 14. Typically, the well for the stator cover 14 is as wide as possible in the stator to keep it from sliding and also to help insure that the growth solution is not contaminated by graphite. It is also long enough to underlie the growth solution well 15 for the throw, i.e., alternate positions, of the slider 10. The depth of the well for the stator cover plate 14 is made to match the thickness of the stator cover plate 14, such that the top surface of the plate 14 and the stator 11 are coplanar. The actual thickness of the plate is not critical. The well for the thin film substrate 12 is machined to be slightly larger than the size of the desired thin film. Sapphire spacers 13 are cut to surround the substrate 12 within the well. The depth of the well matches the thickness of the available substrate, for example, 0.040 inches deep. The depth of the well for substrate 12 is also made so that the top surface of substrate 12 is slightly below the top surface of plate 14. Substrate spacers 13 may be as much as 0.010 inches thinner than the thickness of substrate 12 without affecting performance of the device. Both wells for cover plate 14 and substrate 12 may be end-milled to accept square-edged pieces. The slider 10 includes a block of graphite which has been recess-milled to provide minimal contact surfaces with the stator 11, as shown in FIGS. 2A and 2B.

A well for the growth solution extends through the slider 10, and is lined with a monocrystalline sapphire tube or liner 15. The cross-sectional size and shape of the liner 15 is selected to match or to exceed the size of the desired finished thin film 22, for example, 0.5 inches square. The thickness of the walls of the liner may be selected to enhance or diminish the insulating effect of the sapphire liner, as required. Typically, the liner walls are 0.030 inches thick. The base surface of the liner which faces the stator is fine ground or polished flat to within 50 microinches to insure that the substrate 12 or finished film 22 will not be scratched when the slider is moved. The liner 15 is press fit into the slider such that the polished base surface is within 0.001 inches of the top surface of the stator cover plate 14. In addition, a sapphire plank 18 may be press fit into the recessed base of slider 10 to prevent graphite flakes from dropping from the slider onto the thin film 22 or substrate 12. A sapphire cap 16 to the growth solution well may be included to reduce contamination of the growth solution 17.

Figure 3:
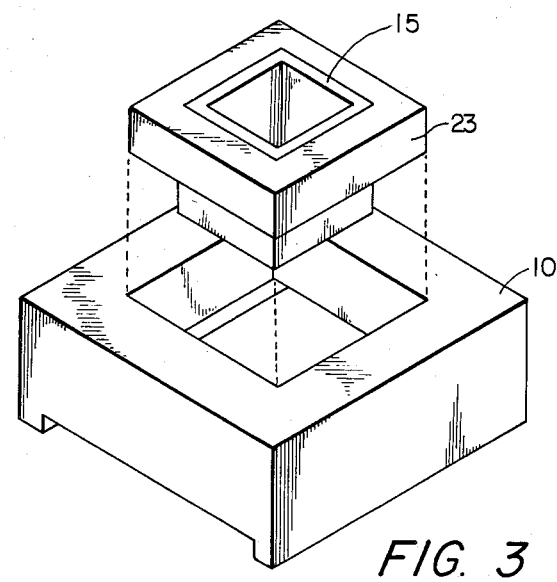
FIGS. 3 and 4 show the use of interchangeable growth wells which may be used in the slider assembly of the present invention.
Figure 4:
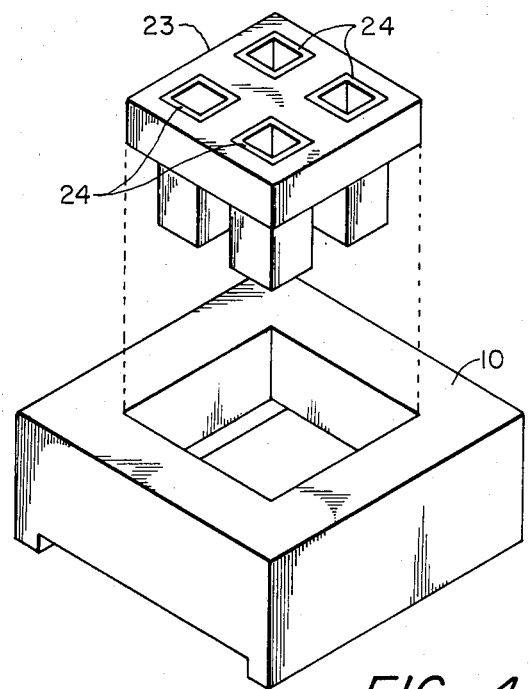

In an alternate embodiment, the section of the slider which includes the growth solution well is removable, and may be replaced with an insert 23 for multiple or different sized substrates 24 as shown in FIGS. 3 and 4. In these configurations, the same slider and stator assembly may be used for a variety of thin film manufacturing tasks without building a new assembly for each new substrate design.

Figure 2C:
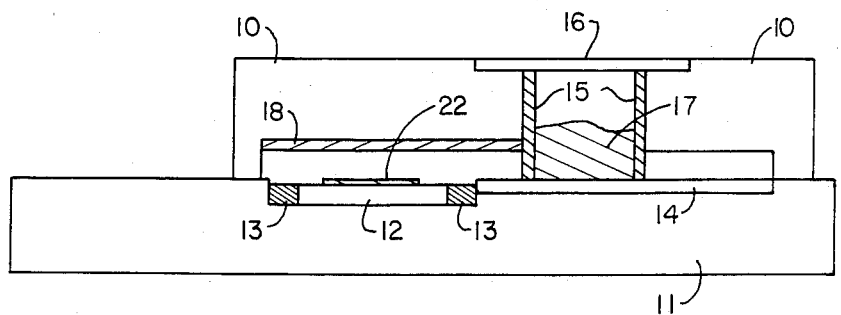

The subject invention operates in the following manner. Prior to use, all parts are assembled and purified at high temperatures as described above. The CdTe substrate 12 is placed in the substrate well of the stator 11 and surrounded on each side by sapphire spacers 13. The slider is positioned on the stator as shown in FIG. 2A; the HgCdTe growth material 17 is loaded into the growth solution well, and then capped by cover 16. The assembly is placed in a reaction tube and furnace and brought to the appropriate temperature. The slider is moved by pushrod, gravity or some external means so that the growth solution 17 is in contact with the substrate 12, as shown in FIG. 2B. The temperature of the apparatus is then lowered to force precipitation of the thin film HgCdTe 22. After thin film growth, the slider 10 is returned to its initial position, as shown in FIG. 2C, so that the finished film 22 is removed from contact with the growth solution 17. When the apparatus has cooled, the slider 10 may be removed, exposing the completed thin film 22 on substrate 12. The substrate 12 with thin film 22 are then removed for further processing for use in, for example, an infrared detecting device.

Having described the invention, what is claimed as new and novel and for which it is desired to secure Letters Patent is:

1. Apparatus for producing thin film materials, said apparatus comprising:
   A. a slider assembly made out of a first material;
   B. a stator assembly made out of said first material and having means for guiding movement of said slider assembly on said stator assembly, said slider assembly sliding along said stator assembly between a first position and second position;
   C. holding means, included in said slider assembly, for retaining a growth solution, wherein said holding means is made of a second material and is used to prevent said growth material from contacting said first material of said slider assembly;
   D. retention means, included in said stator assembly, for holding a thin film substrate material said retention means being made of said second material;
   E. protection means mounted on a side of said stator assembly between said stator assembly and said slider assembly and contiguous to said retention means, said protection means being made of said second material; and
   F. prevention means made of said second material contiguous with said holding means and mounted on a side of said slider assembly so that it is between said slider assembly and said stator assembly, said protection means, said prevention means, said retention means, and said holding means cooperating to prevent said growth solution from contacting either the first material of said slider assembly or the first material of said stator assembly as said slider assembly slides along said stator assembly between said first position and said second position to prevent contamination of said growth solution by said first material.

2. Apparatus as in claim 1 wherein said second material from which said holding means, said retention means, said preventing means and said protection means are made is nonwetting so as to substantially prevent contamination and adhesion of said growth solution to said slider assembly and to said stator assembly.

3. Apparatus as in claim 2 wherein said second material is either sapphire or alumina.

4. Apparatus as in claim 2 wherein said holding means extends through said slider assembly so that said growth solution may be placed in said holding means at one end thereof while said slider assembly is on said stator assembly.

5. Apparatus as in claim 4 further comprising means for covering said holding means at said one end after said growth solution has been placed in said holding means so as to substantially reduce contamination of said growth solution.

6. Apparatus as in claim 5 wherein said means for covering may be made from either sapphire or alumina.

* * * * *